(12) United States Patent
Heckleman et al.

(10) Patent No.: US 8,040,141 B2
(45) Date of Patent: Oct. 18, 2011

(54) ORTHOGONAL RADIO FREQUENCY VOLTAGE/CURRENT SENSOR WITH HIGH DYNAMIC RANGE

(75) Inventors: Todd Heckleman, Spencerport, NY (US); David J. Coumou, Webster, NY (US); Yogendra K. Chawla, Pittsford, NY (US)

(73) Assignee: MKS Instruments, Inc., Andover, MA (US)

( * ) Notice: Subject to any disclaimer, the term of this patent is extended or adjusted under 35 U.S.C. 154(b) by 373 days.

(21) Appl. No.: 12/421,196

(22) Filed: Apr. 9, 2009

(65) Prior Publication Data
US 2009/0256580 A1    Oct. 15, 2009

Related U.S. Application Data

(60) Provisional application No. 61/043,934, filed on Apr. 10, 2008.

(51) Int. Cl.
*G01R 27/28* (2006.01)
*G01R 31/06* (2006.01)
*G01R 15/18* (2006.01)

(52) U.S. Cl. .......................... 324/654; 324/547; 324/127

(58) Field of Classification Search .................. 324/654, 324/649, 600, 76.69, 522, 713, 239, 241, 324/546, 547, 537, 500, 555, 76.11; 702/127, 702/726; 70/1, 57, 64; 340/646, 538.16, 340/12.38, 636.12, 636.13, 636.15, 660, 340/643, 664; 361/93.5, 93.6, 836, 79, 86, 361/87
See application file for complete search history.

(56) References Cited

U.S. PATENT DOCUMENTS

| 3,667,040 | A | * | 5/1972 | Grinoch | 324/106 |
|---|---|---|---|---|---|
| 5,025,208 | A | * | 6/1991 | Danzeisen | 324/76.12 |
| 5,633,648 | A | * | 5/1997 | Fischer | 343/788 |
| 5,808,415 | A | | 9/1998 | Hopkins | |
| 5,834,931 | A | * | 11/1998 | Moore et al. | 324/95 |
| 6,061,006 | A | * | 5/2000 | Hopkins | 341/61 |
| 6,333,634 | B1 | * | 12/2001 | Haze et al. | 324/709 |
| 6,501,285 | B1 | | 12/2002 | Hopkins et al. | |
| 2003/0090356 | A1 | | 5/2003 | Saito et al. | |
| 2007/0285089 | A1 | | 12/2007 | Ibuki et al. | |

FOREIGN PATENT DOCUMENTS

WO    WO-01/98789 A1    12/2001
WO    WO-2007/109276    9/2007

OTHER PUBLICATIONS

International Search Report for International Patent Application No. PCT/US2009/040226 dated Sep. 14, 2009.

* cited by examiner

*Primary Examiner* — Hoai-An D Nguyen
(74) *Attorney, Agent, or Firm* — Harness, Dickey & Pierce, P.L.C.

(57) ABSTRACT

A radio frequency (RF) sensor that measures RF current includes a substrate that has an inner perimeter that defines an aperture. A conductor extends through the aperture. Sensor pads are arranged on the aperture and are connected to form two sensor loops. The loops generate an electrical signal that represents RF current flow through the center conductor. Additionally, a plurality of circular conductive rings may be included in the RF sensor to generate a signal representing the voltage of the conductor.

28 Claims, 10 Drawing Sheets

US 8,040,141 B2

ORTHOGONAL RADIO FREQUENCY VOLTAGE/CURRENT SENSOR WITH HIGH DYNAMIC RANGE

CROSS-REFERENCE TO RELATED APPLICATIONS

This application claims the benefit of U.S. Provisional Application No. 61/043,934, filed on Apr. 10, 2008. The disclosure of the above application is incorporated herein by reference.

FIELD

The present disclosure relates to radio frequency sensors and, more particularly, to an orthogonal radio frequency voltage/current sensor.

BACKGROUND

A radio frequency (RF) current sensor, which is also known as a probe, generates a signal that represents the magnitude of current flow through an RF conductor. The current probe can be combined with a voltage probe to form an RF voltage/current (VI) probe that generates a second signal that represents the RF voltage with respect to a reference potential, such as an RF ground or shield conductor.

RF current and VI probes are used in RF control circuits to provide feedback information. The feedback information may be used to control an RF amplifier that provides the RF power that is being measured. In some applications the RF power is employed to generate plasma for semiconductor manufacturing, metal coating, or micromachining processes.

SUMMARY

In various embodiments of the present disclosure, a radio frequency (RF) sensor that measures RF current is disclosed. The RF sensor includes a substrate including a first exterior layer, a second exterior layer, a first interior layer, a second interior layer and an inner perimeter that defines an aperture through the substrate. The RF sensor further includes a first loop having a first plurality of sensor pads coupled to a first plurality of vias by a first plurality of traces, and a second loop having a second plurality of sensor pads coupled to a second plurality of vias by a second plurality of traces. The first and second plurality of sensor pads are arranged on the inner perimeter of the substrate. A center conductor for carrying RF current extends through the aperture and the first and second loops generate an electrical signal that represents RF current flow through the center conductor.

In various embodiments of the present disclosure, a radio frequency (RF) sensor that measures RF current is disclosed. The RF sensor includes a substrate having a first ground plane, a second ground plane and an inner perimeter that defines an aperture through the substrate. The RF sensor further includes a first loop that has a first plurality of sensor pads coupled to a first plurality of vias by a first plurality of traces, and a second loop that has a second plurality of sensor pads coupled to a second plurality of vias by a second plurality of traces. The first and second plurality of sensor pads extend along and are spaced uniformly across the inner perimeter of the substrate. A conductor for carrying RF current extends through the aperture and the first and second loops generate an electrical signal that represents RF current flow through the conductor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
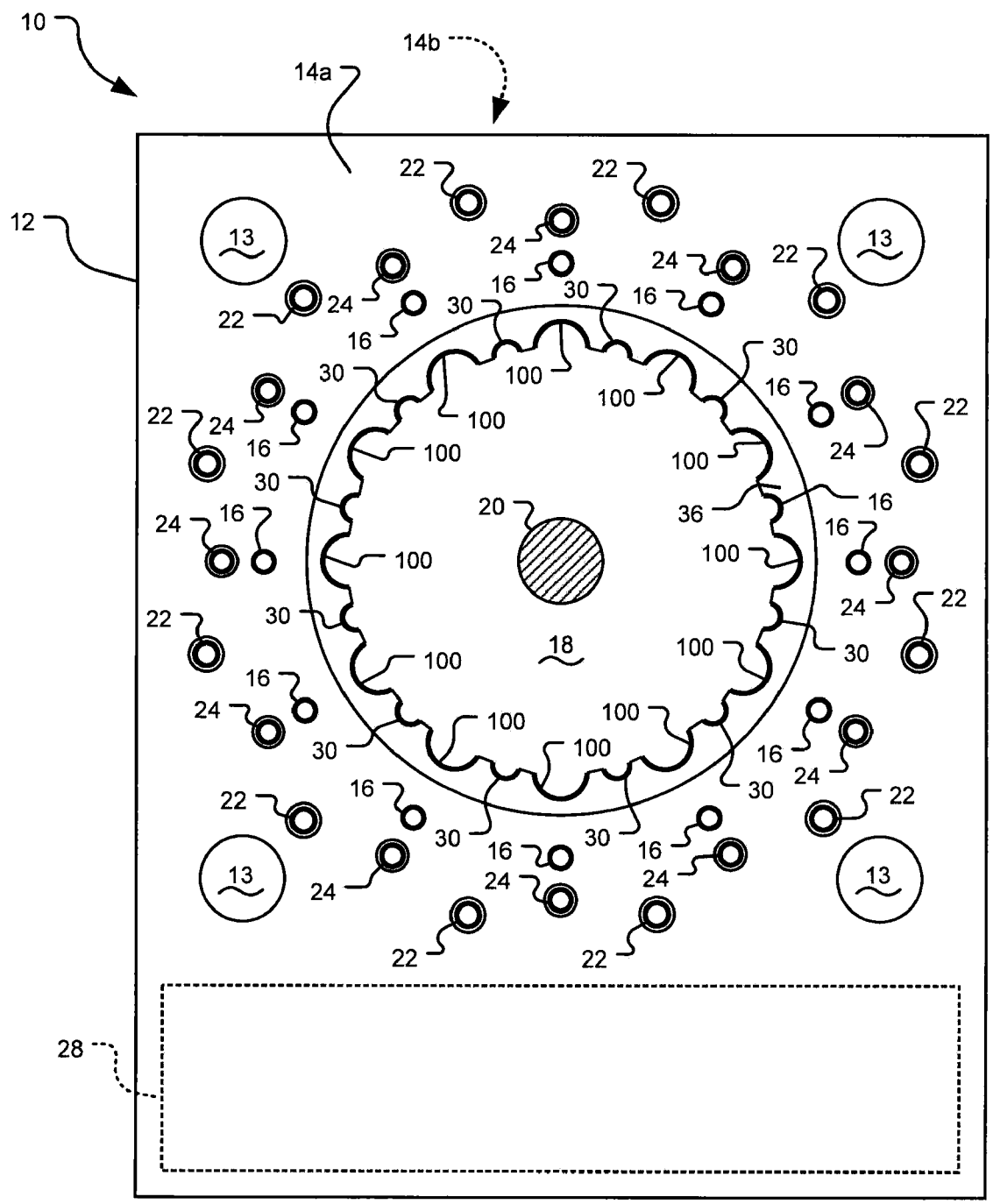
FIG. 1 is a plan view of an orthogonal radio frequency (RF) current and voltage sensor according to various embodiments of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 1, an orthogonal radio frequency (RF) voltage/current (VI) probe 10 is shown. VI probe 10 includes a printed circuit board (PCB) 12 with at least four conductive layers. A first exterior layer 14a and a second exterior layer 14b are parallel with each other and maintained in spaced relationship by an insulating substrate of PCB 12. First and second layers 14a, 14b are collectively referred to as ground planes 14. A number of vias 16 electrically connect ground planes 14 to each other. Vias 16 can be radially spaced around a perimeter of an aperture 18. Vias 16 are electrically insulated from the inner layers of PCB 12, which are described below. Ground planes 14 and vias 16 connect to an outer layer of a coaxial cable (not shown) that carries the RF current being measured. A center conductor of the coaxial cable connects to a conductor 20 that is axially and concentrically positioned within aperture 18. VI probe 10 may also include a plurality of mounting holes 13 to assist in coupling the VI probe 10 to the RF power generator (not shown) to be controlled.

A second plurality of vias 22 are electrically insulated from ground planes 14 and connect current loop-back traces that are located on inner layers of PCB 12. A third plurality of vias 24 are also electrically insulated from ground planes 14 and implement part of a voltage sensor H field cancellation structure. Vias 22 and 24 and their associated traces on inner layers of PCB 12 are described below in more detail.

PCB 12 may also include traces and pads, which are generically indicated at 28, for mounting electronic circuit components that may be connected to ground plane 14 and the various traces of the inner layers of PCB 12. Examples of components include: connectors for providing power to the electronic circuits and/or taking electrical signals from them, amplifiers, transformers, and/or filters that buffer and/or condition the signals that represent the RF voltage and/or current of conductor 20, and the like.

Figure 2:
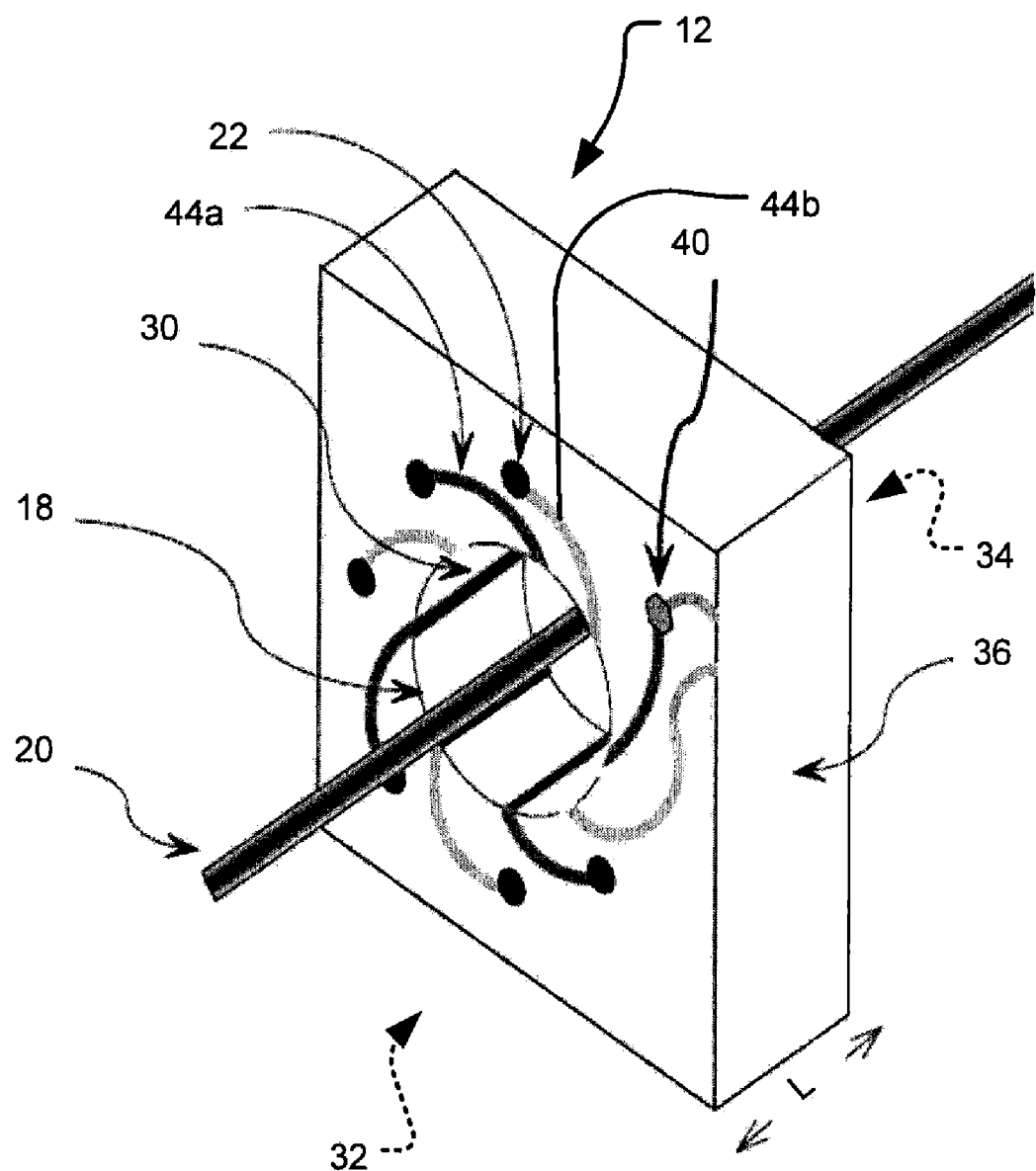
FIG. 2 is an isometric view of current sensor traces of an orthogonal radio frequency (RF) current and voltage sensor according to various embodiments of the present disclosure.

Referring now to FIGS. 2-3, various views of PCB 12 are shown. Ground planes 14, vias 16 and vias 24 are omitted for clarity. A first inner layer 32 includes traces 44a and 44b that are formed on insulating substrate 36. A second inner layer 34 includes more traces 44a and 44b on the opposing side of substrate 36. Traces 44a and 44b are collectively referred to as traces 44. Traces 44 are patterned and connected by vias 22 to form a pair of entwined electrical loops or windings. It should be appreciated that substrate 36 may contain one or more additional conductive layers that are not shown. The additional conductive layers may, e.g., implement a voltage sensor that is described below.

First and second inner layers 32, 34 are positioned underneath and insulated from respective ones of ground planes 14. Vias 22 extend between and connect associated traces 44 on the first and second inner layers as is described below. Associated traces 44 are also connected by respective current sensor pads 30 that are formed along walls of aperture 18. Current sensor pads 30 can be plated to the edge of aperture 18 in substrate 36 and cut to shape by laser, mechanical abrasion or other manufacturing technique.

Insulator substrate 36 gives current sensor pads 30 a length L. While RF current flows through conductor 20, a magnetic field rotates around conductor 20. The magnetic field can be defined by Biot-Savart Law, which provides $$B(\text{radius}) = \frac{\mu_0(AC_{current})}{2\pi \text{ radius}}$$

where radius is the distance between conductor 20 and current sensor pads 30, $AC_{current}$ is the current flowing through conductor 20, and $\mu_0$ is the magnetic constant, equal to $4\pi \times 10^{-7}$ H/m. The magnetic field crosses current sensor pads 30.

From Faraday's law, the induced voltage is a function of the length L of current sensor pads 30, a rate of change of the magnetic field, and a height of a loop formed by current sensor pads 30, traces 44, and vias 22. Increasing the length L, such as by increasing a thickness of substrate 36, increases coupling between the RF coaxial cable (not shown) and VI probe 10.

As L increases, the diameter of vias 22 may also need to be increased in order to reduce the risk of breaking drills during PCB 36 fabrication. Increasing the diameter of vias 22 also increases the size of the sensor and/or reduces the number of current sensor pads 30 or loops (described below) that fit along the perimeter of aperture 18. Increasing the diameter of vias 22 also yields a proportional increase to the capacitive coupling to conductor 20, which allows the electric field ("E field") produced by conductor 20 to contaminate the desired current signals and reduce the dynamic range of the VI probe 10. In various embodiments, the width of the current sensor pads 30 may be made as narrow as is practicable to mitigate E field contamination and dynamic range issues. Edge plated current sensor pads 30 reduce the size and number of vias 22 required to make VI probe 10, which reduces E field contamination of the current signal. The current signal represents the current flowing through conductor 20 and is taken from traces 44.

Figure 3A:
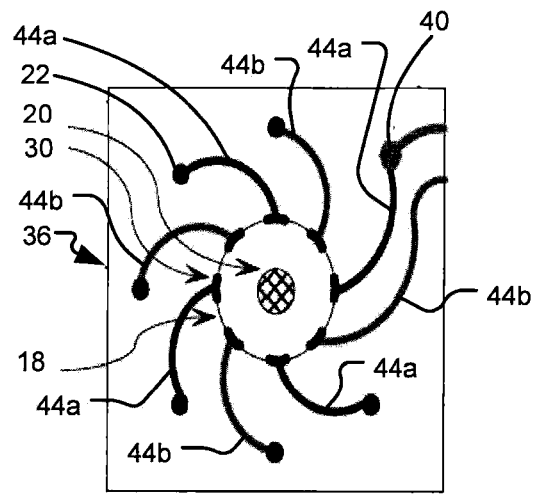
FIGS. 3(a)-(c) are plan views of the current sensor traces of FIG. 2.
Figure 3B:
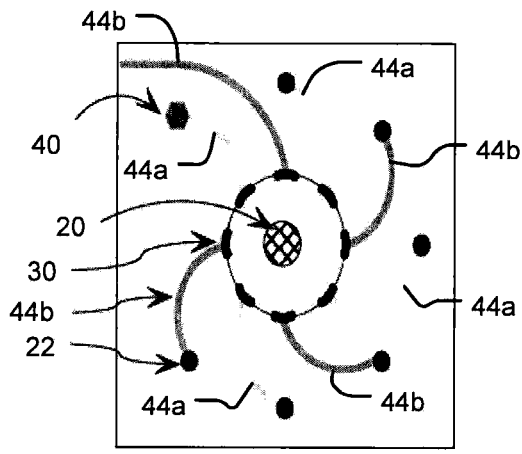
Figure 3C:
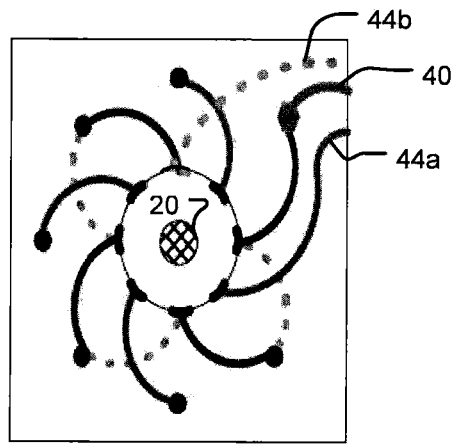

Traces 44 are shown in more detail in FIGS. 3(a)-3(c). Traces 44a and traces 44b are connected to form two entwined loops of wire. Traces 44a and 44b of FIG. 3(a) connect the current sensor pads 30 to the loop back vias 22. The loop back vias 22 connect to the backside of the sensor to another trace 44a or 44b and to the next current sensor pad 30, as shown in FIG. 3(c). For ease of understanding, FIG. 3 depicts the two loops as traces 44a and 44b. The dotted lines are the traces on the back of the board. The hexagon 40 of FIG. 3 may be a common ground point for both loops as one of the RF path ground vias 16. This common ground system may be used to reduce ground loops.

By alternating the current sensor pads 30 with spatial uniformity along the inner perimeter of the opening 18, the current loops provide an autocorrecting feature from movement of the conductor 20, such as from assembly/disassembly of VI probe 10 or thermal changes in the VI probe 10 during operation. The autocorrecting feature of the design works by maintaining a constant sum total distance from the conductor 20 to the current sensor pads 30. If, for example, the conductor 20 moves to the right, the right current sensor pad 30 to conductor 20 distance decreases, but the left current sensor pad 30 to center conductor 20 increases by the same amount, keeping the sum total distance and current signal level the same.

Figure 4:
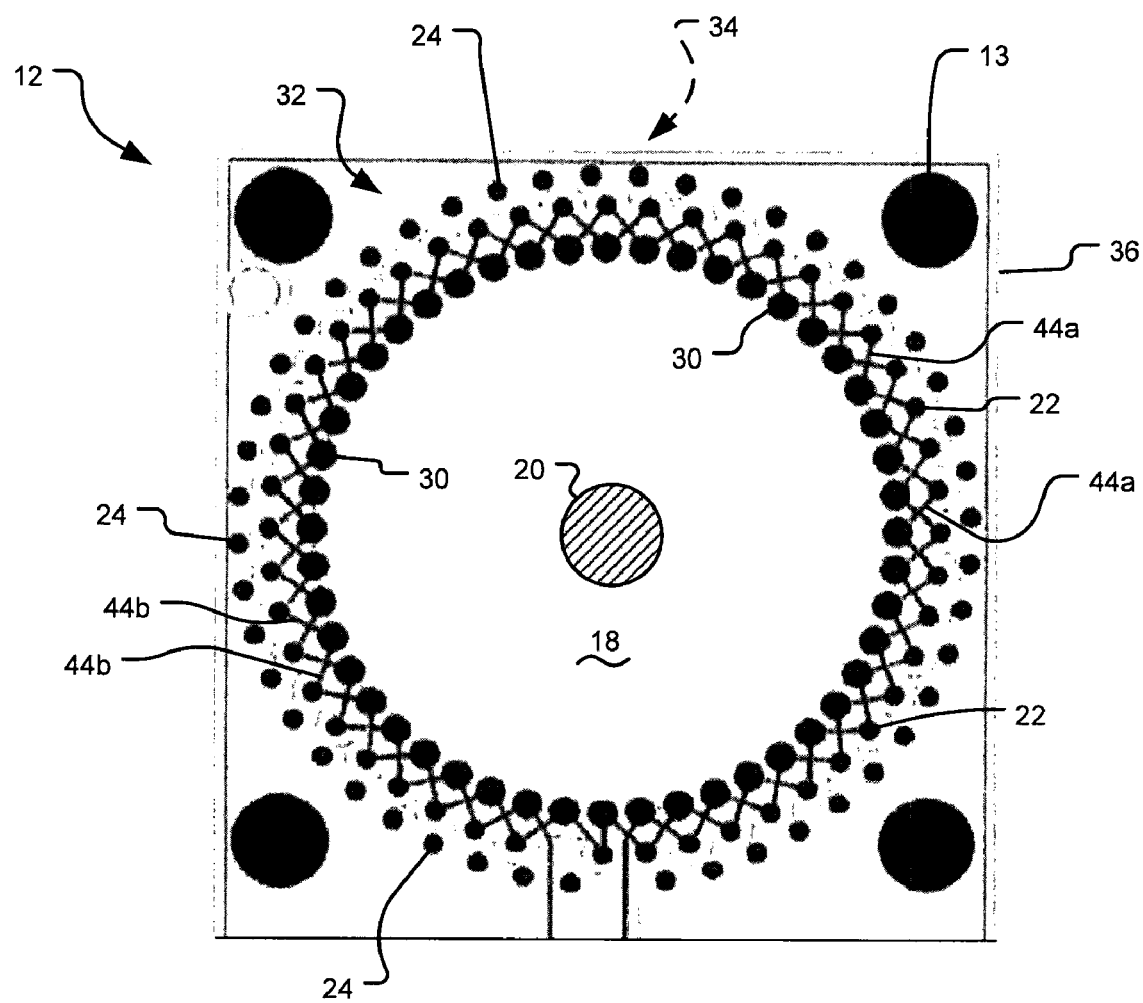
FIG. 4 is a plan view of current sensor traces of an orthogonal radio frequency (RF) current and voltage sensor according to various embodiments of the present disclosure.

Another view of a PCB 12 according to various embodiments of the present disclosure is shown in FIG. 4. Ground planes 14 and vias 16 are omitted for clarity. A first inner layer 32 includes traces 44a and 44b that are formed on insulating substrate 36. A second inner layer 34 includes more traces 44a and 44b on the opposing side of substrate 36. Traces 44a and 44b are collectively referred to as traces 44. Traces 44 are patterned and connected by vias 22 to form a pair of entwined electrical loops or windings. It should be appreciated that substrate 36 may contain one or more additional conductive layers that are not shown. The additional conductive layers may, e.g., implement a voltage sensor that is described below. In the PCB 12 illustrated in FIG. 4, vias 24 are electrically connected to current sensor pads 30 to implement a voltage sensor in the manner described below (see, for example, FIG. 8).

Figure 5A:
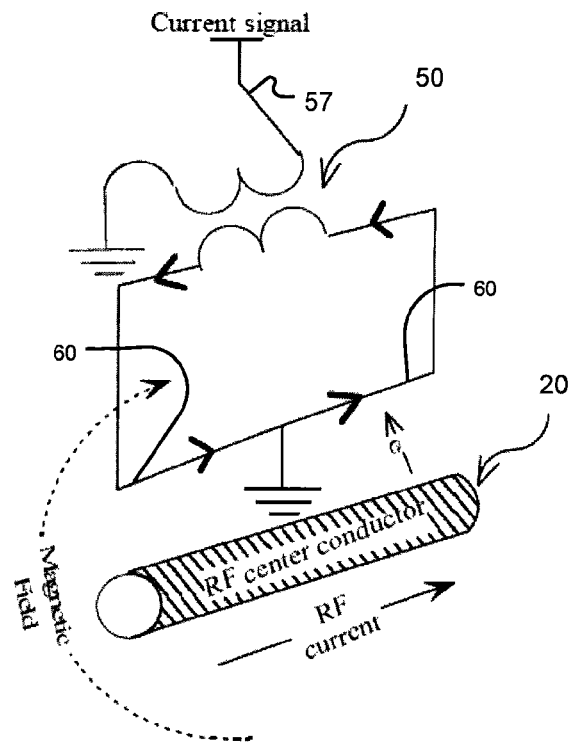
FIG. 5(a) is schematic diagram of a current sensor of the prior art.

A schematic representation of a prior art current sensor is illustrated in FIG. 5(a). From Ampere's law, with the RF current traveling into the page, a magnetic field will be generated in a clockwise direction around the conductor 20. The magnetic field will induce a current on the pickup loops 60 to flow through the transformer 50. Any electric fields picked up by the loops 60 will be shorted to ground. The circuit of FIG. 5(*a*) may act as a current sensor with the sensor loops 60 placed end to end (in series) such that there is no coupling between the loops 60.

Figure 5B:
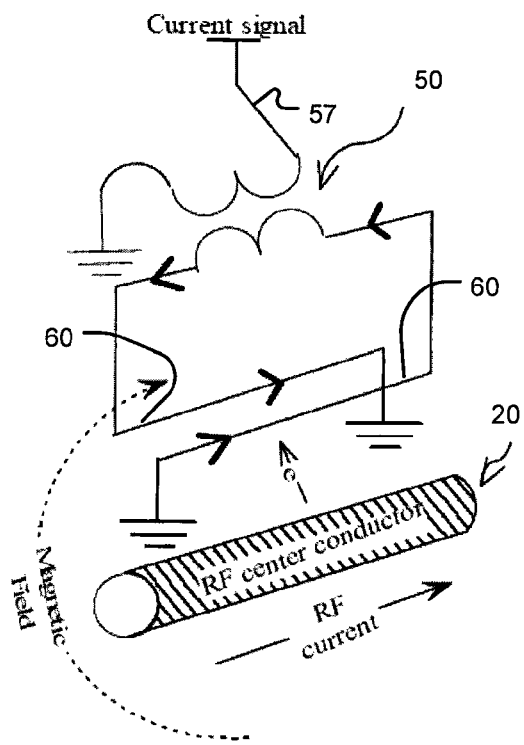
FIGS. 5(b)-(c) and 6 are schematic diagrams of a current sensor according to various embodiments of the present disclosure.
Figure 5C:
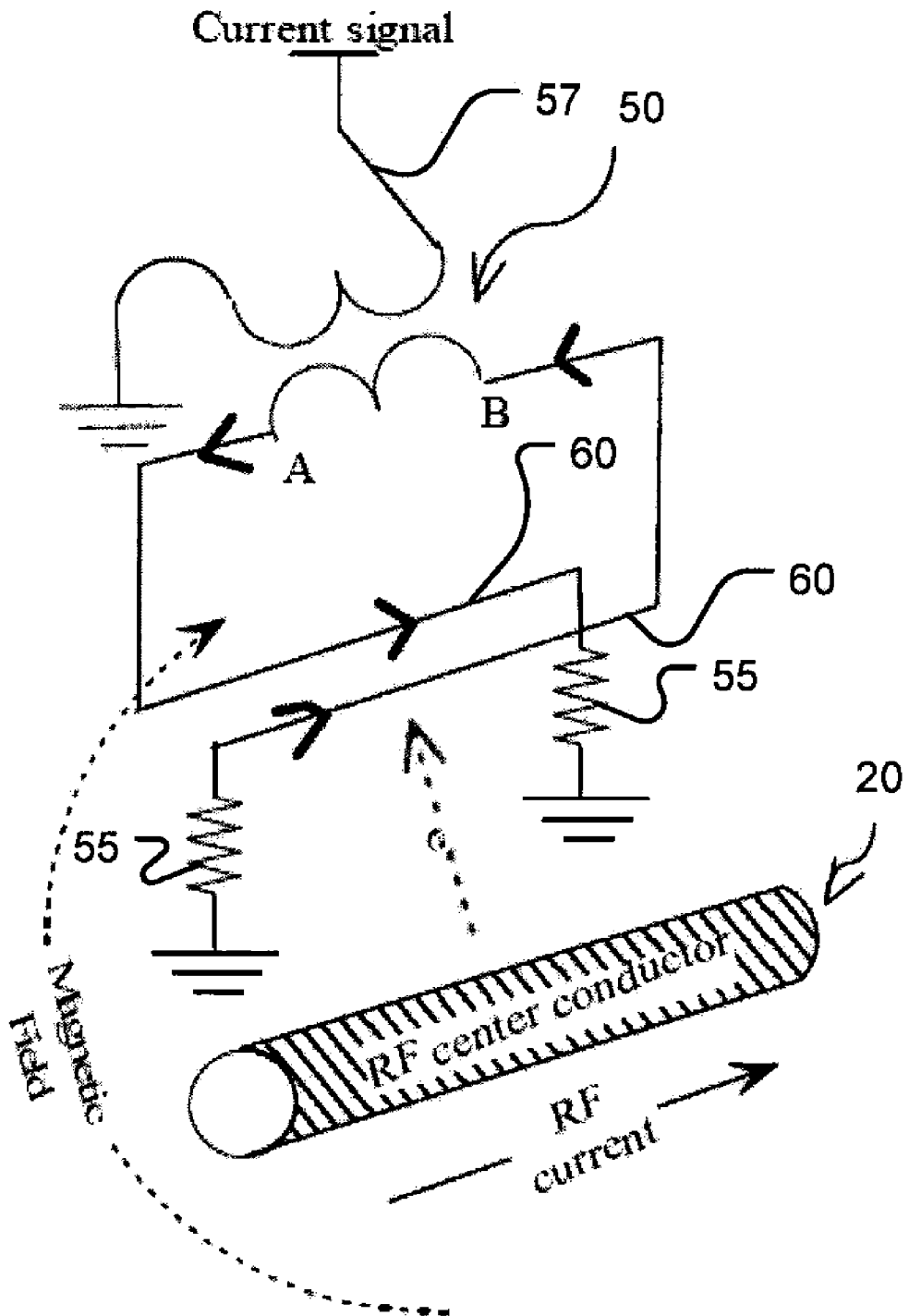

A schematic representation of a current sensor according to various embodiments of the present disclosure is illustrated in FIG. 5(*b*). In the circuit of FIG. 5(*b*), a common ground is utilized for the loops 60. From Ampere's law, with the RF current traveling into the page, a magnetic field will be generated in a clockwise direction around the conductor 20. The magnetic field will induce a current on the pickup loops 60 to flow through the transformer 50. Any electric fields picked up by the loops 60 will be shorted to ground. The circuit of FIG. 5(*b*) includes two loops 60 next to each other (or parallel to each other) and there is no coupling between the loops 60.

A schematic representation of a current sensor according to various embodiments of the present disclosure is illustrated in FIG. 5(*c*). In the circuit of FIG. 5(*c*), the loops 60 are not connected to a common ground. From Ampere's law, with the RF current traveling into the page, a magnetic field will be generated in a clockwise direction around the conductor 20. A resistor 55 in series with each of the two current pick up loops 60 may be included. The resistors 55 may be used to match the sensor impedance to any accompanying processing unit that may be utilized with the VI probe 10, which will result in lower reflected signals, lower noise and maximum sensor signal power transfer to the processing unit. The magnetic field will induce a current on the pickup loops 60 to flow through the transformer 50 and resistors 55. The electric field picked up by loops 60 will not be shorted to ground, as in the case of FIGS. 5(*a*) and 5(*b*). The E fields at points A and B on the transformer 50, however, will be equal, resulting in no current flow through the transformer 50 due to the E field. Therefore, the E field will be effectively canceled on the secondary or output side 57 of the transformer 50. Furthermore, points A and B of transformer 50 will be at relatively the same electrical potential, which will correspond to the electrical potential of the conductor 20 plus an additional component due to contamination from the current signals generated on loops 60 by the magnetic field.

By placing the loops next to each other as depicted in FIGS. 5(*b*) and 5(*c*), the two current loops 60 will be exposed to the same magnetic and electric fields, which results in better cancellation of the E fields and an increase in the current sensor dynamic range. The length of the current sensor pick up lines (for example, current sensor pads 30) is related to the frequency response and coupling of the sensor 10. A longer current sensor pick up will improve signal coupling and the low frequency response of sensor 10, without decreasing the voltage breakdown of the VI probe 10 and other adverse effects.

The transformer 50 generally has a turn ratio ("N") with respect to the primary and secondary windings. The resistors 55 compensate for the real portion of the output impedance. The imaginary portion of the output impedance may be compensated for by presenting real transmission line sensor sections or matching/filter circuits. In various embodiments, the values of the resistors 55 may be defined by:

$$R_{series} = \frac{Z_{output}}{2N^2},$$

where $Z_{output}$ is the desired output impedance presented to the analysis unit and N is the transformer turns ratio.

Figure 6:
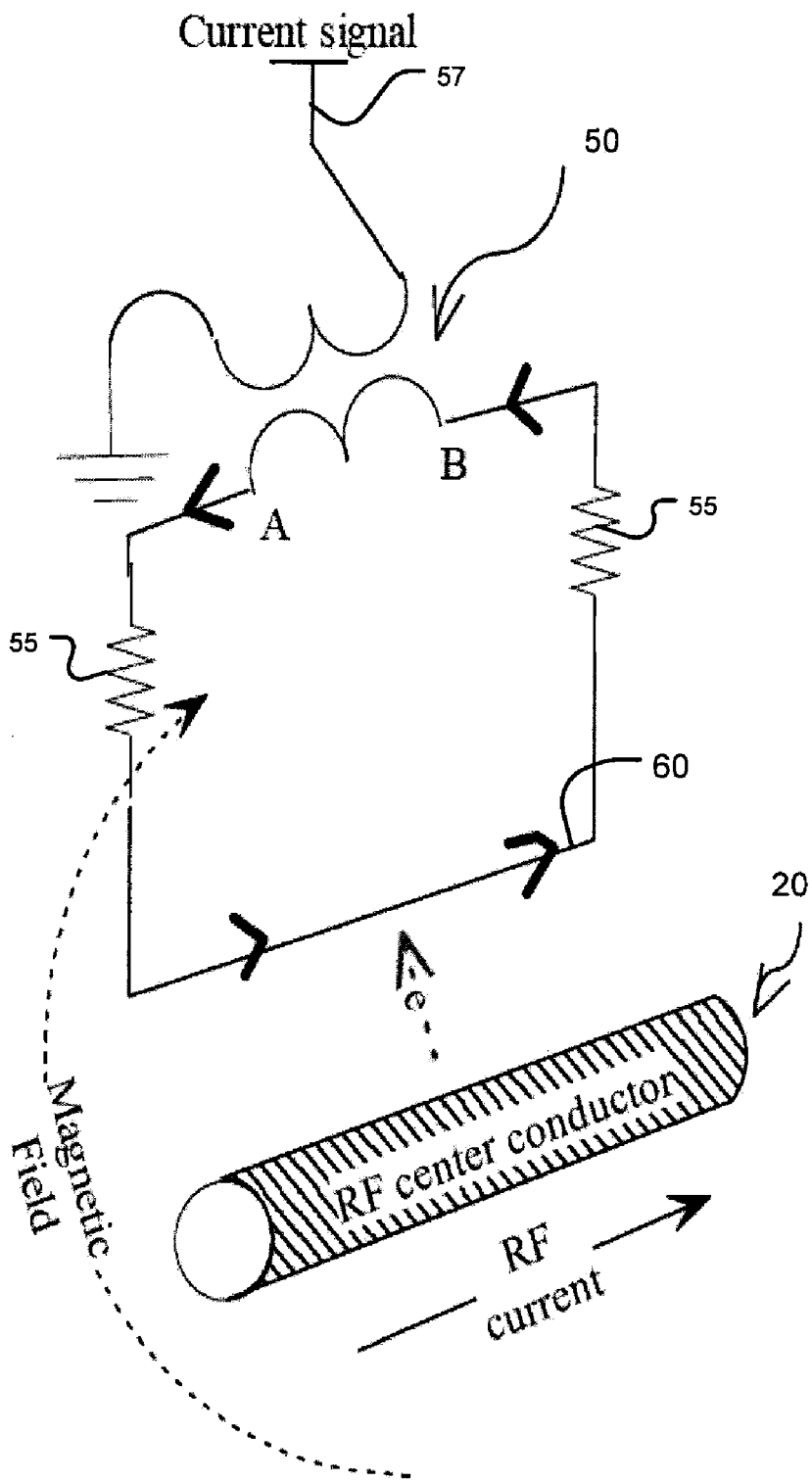

Referring now to FIG. 6, a schematic representation of yet another current sensor according to various embodiments of the present disclosure is illustrated. In the circuit of FIG. 6, the circuit of FIG. 5(*c*) is modified by removing the ground and connecting the loops 60 (for example, end-to-end) to form one continuous loop 60. This may be accomplished, for example, by connecting the traces 44*a* and 44*b* (as shown in FIGS. 4(*a*)-4(*c*)) by a via at the position of the hexagon 40. In this arrangement, the electric field impinged on the current sensor is not shorted to ground and, therefore, the E field potential will cause current to flow through the series resistors 55. The current from the E field will aid in one current loop while reduce the current in the other current loop, which may result in a portion of the E field signal to pass through the transformer 50. This E field contamination may reduce the dynamic range of the current sensor. By removing the current sensor ground from the RF ground, the current sensor ground will not be affected by the RF currents flowing through the PCB board 12 and the current sensor will only measure the current of the conductor 20.

From Ampere's law, with the RF current traveling into the page, a magnetic field will be generated in a clockwise direction around the conductor 20. The resistors 55 may be used to match the sensor impedance to any accompanying processing unit that may be utilized with the VI probe 10, which will result in lower reflected signals, lower noise and maximum sensor signal power transfer to the processing unit. The magnetic field will induce a current on the pickup loops 60 to flow through the transformer 50 and resistors 55. As discussed above, the electric field picked up by loops 60 will not be shorted to ground, as in the case of FIGS. 5(*a*) and 5(*b*). The E fields at points A and B on the transformer 50, however, will be equal, resulting in no current flow through the transformer 50 due to the E field. Therefore, the E field will be effectively canceled on the secondary or output side 57 of the transformer 50. Furthermore, points A and B of transformer 50 will be at relatively the same electrical potential.

As described above, the voltage potential at points A and B are proportional to the electric potential in the conductor 20, due to capacitive coupling. The voltage potential at points A and B can be thought of as the electrical potential of the conductor 20 plus an additional component due to contamination from the current signals generated on loops 60 by the magnetic field.

Figure 7:
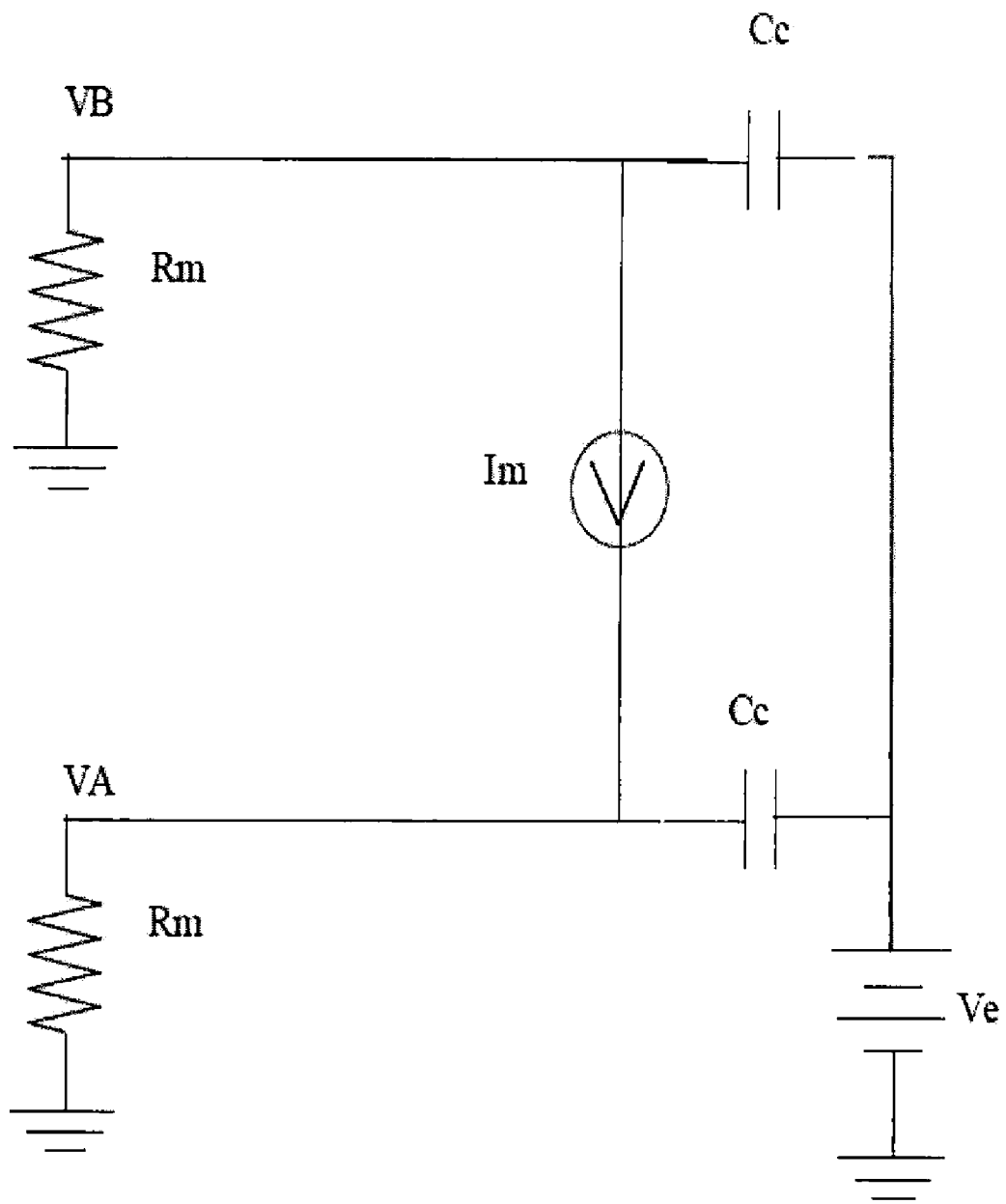
FIG. 7 is a circuit diagram of a circuit that represents the capacitive coupling relationship between the voltage at points A and B to that of the conductor in the current sensor of FIG. 6.

FIG. 7 is a circuit diagram that represents a circuit showing a capacitive coupling relationship between the voltage at points A and B to that of the voltage of the conductor 20 of FIG. 6. In FIG. 7, the resistor $R_m$ is the measurement input impedance, such as in an analog-to-digital converter or receiver; $I_m$ represents the current produced by the changing magnetic field around the conductor 20; $C_c$ represents the distributed coupling capacitance between the conductor 20 and the current loops 60; and $V_e$ is the RF voltage of the conductor 20.

Utilizing the arrangement of FIG. 7, the RF voltage potential of conductor 20 may be defined by Guass's law. Using nodal equations to determine the voltage at points A and B ($V_A$ and $V_B$, respectively) and letting:

$$V_e = V \sin(\omega t);$$

$$I_m = I \cos(\omega t); \text{ and}$$

$$s = j\omega.$$

Kirchhoff's current law equations for each node yields:

$$\frac{V_A}{R_m} + \frac{V_A - V_e}{\frac{1}{sC_c}} - I_m = 0$$

$$\frac{V_A}{R_m} + \frac{V_A - V_e}{\frac{1}{sC_c}} - I_m = 0$$

If we collect like terms:

$$\left(\frac{1}{R_m} + sC_c\right)V_A - V_e sC_c - I_m = 0$$

$$\left(\frac{1}{R_m} + sC_c\right)V_B - V_e sC_c + I_m = 0$$

Solving for $V_A$ and $V_B$ yields:

$$V_A = R_m \frac{V_e sC_c + I_m}{1 + sC_c R_m}$$

$$V_B = -R_m \frac{-V_e sC_c + I_m}{1 + sC_c R_m}$$

Adding $V_A$ and $V_B$ signals ($V_{sum} = V_A + V_B$) with a center tap of the transformer 50 (or, alternatively, by an analog-to-digital converter/digital signal processing ("ADC/DSP") system) yields:

$$V_{sum} = R_m \frac{(V_e sC_c + I_m)}{(1 + sC_c R_m)} + -R_m \frac{(-V_e sC_c + I_m)}{(1 + sC_c R_m)}$$

$$V_{sum} = V_e \frac{2sC_c R_m}{(1 + sC_c R_m)}$$

The result is the E Field of conductor 20, $V_e$, and an attenuation term. Subtracting $V_B$ from $V_A$ ($V_{diff} = V_A - V_B$) with a transformer 50 (secondary winding) or ADC/DSP system yields:

$$V_{diff} = R_m \frac{(V_e sC_c + I_m)}{(1 + sC_c R_m)} - -R_m \frac{(-V_e sC_c + I_m)}{(1 + sC_c R_m)}$$

$$V_{diff} = I_m \frac{2R_m}{(1 + sC_c R_m)}$$

The result is current flowing through conductor 20, $I_m$, and an attenuation term. From these equations, the voltage ($V_e$) and current ($I_m$) of conductor 20 may be determined.

Figure 8:
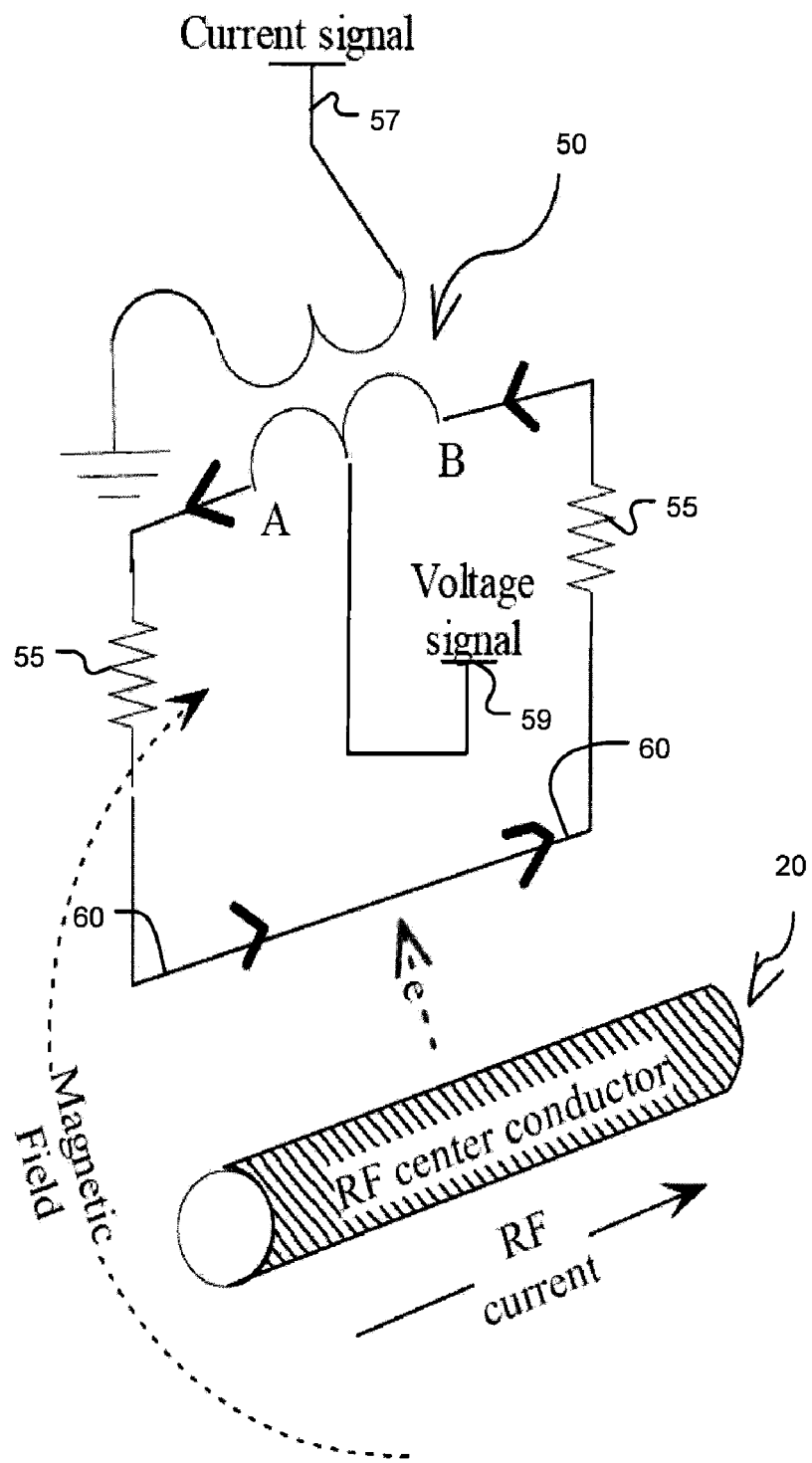
FIG. 8 is a schematic diagram of a voltage current sensor according to various embodiments of the present disclosure.

A schematic representation of a voltage/current sensor according to various embodiments of the present disclosure is illustrated in FIG. 8. From Ampere's law, with the RF current traveling into the page, a magnetic field will be generated in a clockwise direction around the conductor 20. The magnetic field will induce a current on the pickup loops 60 to flow through the transformer 50. Similar to the circuit illustrated in FIG. 6, the electric field impinged on the voltage/current sensor is not shorted to ground and, therefore, the E field potential will cause current to flow through the series resistors 55. The current from the E field will aid in one current loop while reduce the current in the other current loop, which may result in a portion of the E field signal to pass through the transformer 50. This E field contamination may reduce the dynamic range of the current sensor. By removing the current sensor ground from the RF ground, the current sensor ground will not be affected by the RF currents flowing through the PCB board 12 and the current sensor will only measure the current of the conductor 20. The electrical signal representing the current of the conductor 20 may be obtained from the secondary side 57 of the transformer 50. A center tap 59 of the transformer 50 may be utilized to obtain the electrical signal representing the voltage of the conductor 20. From these electrical signals, the voltage and current of the conductor 20 may be determined, e.g., based on the equations set forth above.

Figure 9A:
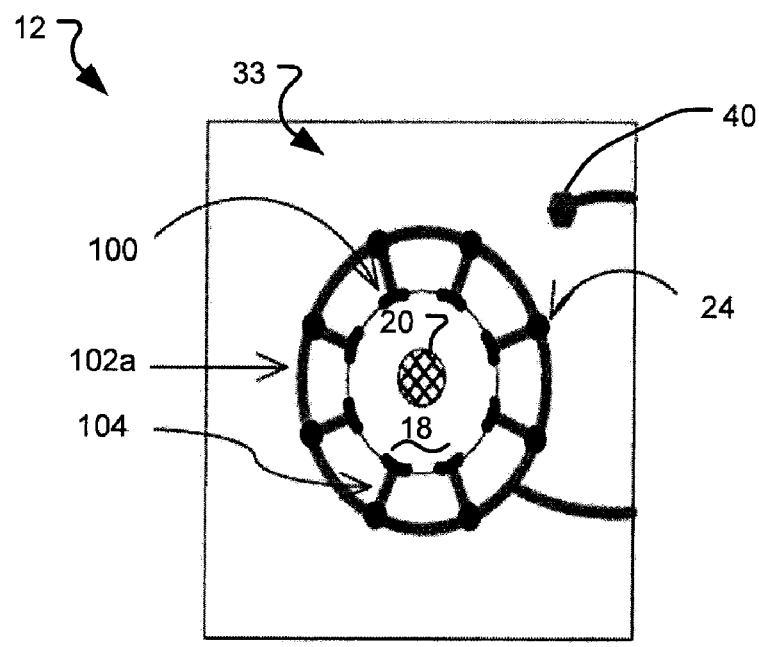
FIGS. 9(a)-(b) are plan views of circular conductive rings of a voltage current sensor according to various embodiments of the present disclosure.
Figure 9B:
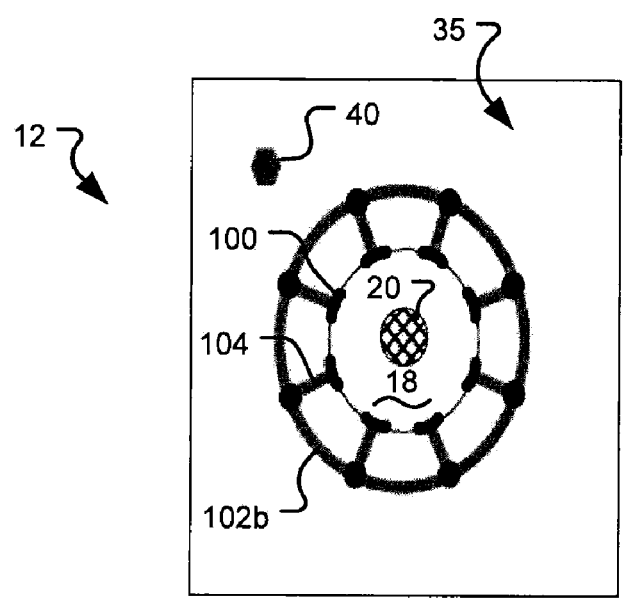

Referring now to FIGS. 9(a) and 9(b), various views of PCB 12 are shown. Ground planes 14, vias 16 and vias 22 are omitted for clarity. A third inner layer 33 includes a circular conductive ring 102a that is formed on insulating substrate 36. A fourth inner layer 35 includes another circular conductive ring 102b on the opposite side of substrate 36. Circular conductive rings 102a and 102b are collectively referred to as circular conductive rings 102. Circular conductive rings 102 are patterned and connected to each other by vias 24. Each of the circular conductive rings 102 defines a plane that is orthogonal to the longitudinal axis of the conductor 20. Furthermore, traces 104 couple each of the circular conductive rings 102 to voltage sensor pads 100 that are formed along walls of aperture 18. In some embodiments, the voltage sensor pads 100 may be the same as the current sensor pads 30 described above. Voltage sensor pads 100 can be plated to the edge of aperture 18 in substrate 36 and cut to shape by laser, mechanical abrasion or other manufacturing technique. Hexagon 40 may be utilized as a reference ground for determining a voltage of the conductor 20.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A radio frequency (RF) sensor that measures RF current, comprising:
   a substrate including a first exterior layer, a second exterior layer, a first interior layer, a second interior layer and an inner perimeter that defines an aperture through the substrate;
   a first loop comprising a first plurality of sensor pads coupled to a first plurality of vias by a first plurality of traces, the first plurality of sensor pads being arranged on a wall of the aperture; and
   a second loop comprising a second plurality of sensor pads coupled to a second plurality of vias by a second plurality of traces, the second plurality of sensor pads being arranged on the wall of the aperture,
   wherein a center conductor for carrying RF current extends through the aperture and the first and second loops generate an electrical signal that represents RF current flow through the center conductor.

2. The RF sensor of claim 1, further comprising a first circular conductive ring and a second circular conductive ring, each of the first and second circular conductive rings being coupled to a third plurality of sensor pads by a third plurality of traces, wherein:

the first circular conductive ring is further coupled to the second circular conductive ring by a third plurality of vias, and the first and second circular conductive rings generate a second electrical signal that represents RF voltage of the center conductor.

3. The RF sensor of claim 2, wherein the third plurality of sensor pads comprises at least one of the first plurality of sensor pads and the second plurality of sensor pads.

4. The RF sensor of claim 2, wherein the substrate has a substrate length and the first plurality of sensor pads, the second plurality of sensor pads and the third plurality of sensor pads extend along the length of the substrate.

5. The RF sensor of claim 2, wherein:
the substrate includes a third interior layer and a fourth interior layer;
the first circular conductive ring is formed on the third interior layer;
the second circular conductive ring is formed on the fourth circular conductive ring; and
the third plurality of vias extend between the third interior layer and fourth interior layer.

6. The RF sensor of claim 1, wherein the first plurality of sensor pads and second plurality of sensor pads are spaced uniformly on the wall of the aperture.

7. The RF sensor of claim 6, wherein the first plurality of sensor pads and second plurality of sensor pads are arranged along the wall of the aperture such that a sum total distance from the conductor to the first plurality of sensor pads and second plurality of sensor pads is maintained.

8. The RF sensor of claim 1, wherein the first and second loops share a common ground.

9. The RF sensor of claim 1, wherein the substrate has a substrate length and the first plurality of sensor pads and the second plurality of sensor pads extend along the length of the substrate.

10. The RF sensor of claim 1, wherein the first exterior layer and the second exterior layer are ground planes.

11. The RF sensor of claim 1, wherein the first plurality of traces and the second plurality of traces are formed on the first interior layer and second interior layer, wherein the first plurality of vias and second plurality of vias extend between the first interior layer and second interior layer.

12. A radio frequency (RF) sensor that measures RF current, comprising:
a substrate including an inner perimeter that defines an aperture through the substrate;
a first loop comprising a first plurality of sensor pads coupled to a first plurality of vias by a first plurality of traces, the first plurality of sensor pads being arranged and spaced uniformly on a wall of the aperture; and
a second loop comprising a second plurality of sensor pads coupled to a second plurality of vias by a second plurality of traces, the second plurality of sensor pads being arranged and spaced uniformly on the wall of the aperture,
wherein a conductor for carrying RF current extends through the aperture and the first and second loops generate an electrical signal that represents RF current flow through the conductor.

13. The RF sensor of claim 12, further comprising a first circular conductive ring and a second circular conductive ring, each of the first and second circular conductive rings being coupled to a third plurality of sensor pads by a third plurality of traces, wherein:

the first circular conductive ring is further coupled to the second circular conductive ring by a third plurality of vias, and the first and second circular conductive rings generate a second electrical signal that represents RF voltage of the center conductor.

14. The RF sensor of claim 13, wherein the third plurality of sensor pads comprises at least one of the first plurality of sensor pads and the second plurality of sensor pads.

15. The RF sensor of claim 13, wherein the substrate has a substrate length and the first plurality of sensor pads, the second plurality of sensor pads and the third plurality of sensor pads extend along the length of the substrate.

16. The RF sensor of claim 13, wherein the first circular conductive ring defines a plane that is orthogonal to a longitudinal axis of the conductor.

17. The RF sensor of claim 12, wherein the substrate has a substrate length and the first plurality of sensor pads and the second plurality of sensor pads extend along the length of the substrate.

18. The RF sensor of claim 12, wherein the first plurality of traces and the second plurality of traces are formed on a first interior layer and a second interior layer of the substrate, wherein the first plurality of vias and second plurality of vias extend between the first interior layer and second interior layer.

19. The RF sensor of claim 12, wherein the first and second loops share a common ground.

20. The RF sensor of claim 12, wherein the first plurality of sensor pads and second plurality of sensor pads are arranged on the wall of the aperture such that a sum total distance from the conductor to the first plurality of sensor pads and second plurality of sensor pads is maintained.

21. A radio frequency (RF) sensor that measures RF current, comprising:
a substrate including an inner perimeter that defines an aperture through the substrate;
a first loop comprising a first plurality of sensor pads coupled to a first plurality of vias by a first plurality of traces, the first plurality of sensor pads being arranged on a wall of the aperture; and
a second loop comprising a second plurality of sensor pads coupled to a second plurality of vias by a second plurality of traces, the second plurality of sensor pads extending along the inner perimeter,
wherein a conductor for carrying RF current extends through the aperture and the first and second loops generate an electrical signal that represents RF current flow through the conductor.

22. The RF sensor of claim 21, further comprising a first circular conductive ring and a second circular conductive ring, each of the first and second circular conductive rings being coupled to a third plurality of sensor pads by a third plurality of traces, wherein:
the first circular conductive ring is further coupled to the second circular conductive ring by a third plurality of vias, and
the first and second circular conductive rings generate a second electrical signal that represents RF voltage of the center conductor.

23. The RF sensor of claim 22, wherein the third plurality of sensor pads comprises at least one of the first plurality of sensor pads and the second plurality of sensor pads.

24. The RF sensor of claim 22, wherein the substrate has a substrate length and the first plurality of sensor pads, the second plurality of sensor pads and the third plurality of sensor pads extend along the length of the substrate.

25. The RF sensor of claim 22, wherein the first circular conductive ring defines a plane that is orthogonal to a longitudinal axis of the conductor.

26. The RF sensor of claim 21, wherein the substrate has a substrate length and the first plurality of sensor pads and the second plurality of sensor pads extend along the length of the substrate.

27. The RF sensor of claim 21, wherein the first plurality of traces and the second plurality of traces are formed on a first interior layer and a second interior layer of the substrate, wherein the first plurality of vias and second plurality of vias extend between the first interior layer and second interior layer.

28. The RF sensor of claim 21, wherein the first plurality of sensor pads and second plurality of sensor pads are arranged on the wall of the aperture such that a sum total distance from the conductor to the first plurality of sensor pads and second plurality of sensor pads is maintained.

* * * * *

UNITED STATES PATENT AND TRADEMARK OFFICE
CERTIFICATE OF CORRECTION

| | | |
|---|---|---|
| PATENT NO. | : 8,040,141 B2 | Page 1 of 1 |
| APPLICATION NO. | : 12/421196 | |
| DATED | : October 18, 2011 | |
| INVENTOR(S) | : Todd Heckleman et al. | |

It is certified that error appears in the above-identified patent and that said Letters Patent is hereby corrected as shown below:

<u>Column 10,</u>
Lines 44-45, claim 21, "extending along the inner perimeter" should be deleted and replaced with --being arranged on the wall of the aperture--.

Signed and Sealed this
Sixth Day of March, 2012

David J. Kappos
*Director of the United States Patent and Trademark Office*